United States Patent [19]
Ghanbari

[11] Patent Number: 5,556,521
[45] Date of Patent: Sep. 17, 1996

[54] SPUTTER ETCHING APPARATUS WITH PLASMA SOURCE HAVING A DIELECTRIC POCKET AND CONTOURED PLASMA SOURCE

[75] Inventor: Ebrahim Ghanbari, West Nyack, N.Y.

[73] Assignees: Sony Corporation, Tokyo, Japan; Materials Research Corporation, Orangeburg, N.Y.

[21] Appl. No.: 410,362

[22] Filed: Mar. 24, 1995

[51] Int. Cl.⁶ .............................. C23C 14/34; C23F 1/02
[52] U.S. Cl. ............... 204/192.32; 204/298.31; 204/298.33; 204/298.34; 204/298.37; 118/723 R; 118/723 I; 156/345
[58] Field of Search .................. 204/298.31, 298.33, 204/298.34, 298.37, 192.32; 156/345; 118/723 R, 723 E, 723 I, 723 IR

[56] References Cited

U.S. PATENT DOCUMENTS

| | | | |
|---|---|---|---|
| 4,632,719 | 12/1986 | Chow et al. | 156/345 |
| 4,948,458 | 8/1990 | Ogle | 118/723 I |
| 5,198,725 | 3/1993 | Chen et al. . | |
| 5,200,232 | 4/1993 | Tappan et al. . | |
| 5,226,967 | 7/1993 | Chen et al. | 118/723 I |
| 5,234,526 | 8/1993 | Chen et al. . | |
| 5,234,529 | 8/1993 | Johnson | 204/298.34 |
| 5,304,279 | 4/1994 | Coultas et al. | 118/723 I |
| 5,309,063 | 5/1994 | Singh | 118/723 R |
| 5,368,646 | 11/1994 | Yasuda et al. . | |
| 5,368,710 | 11/1994 | Chen et al. . | |
| 5,391,281 | 2/1995 | Hieronymi et al. | 204/298.31 |

Primary Examiner—Nam Nguyen
Assistant Examiner—Rodney G. McDonald
Attorney, Agent, or Firm—Wood, Herron & Evans, P.L.L.

[57] ABSTRACT

Apparatus for sputter etching a substrate includes a processing chamber with a plasma source coupled to the top of the processing chamber to seal the chamber and create a plasma therein. The plasma source comprises a dielectric plate having a generally centered pocket with a concave outer surface and a convex inner surface which physically extends into the processing chamber toward a substrate. An inductive coil is positioned outside the chamber generally inside the pocket and adjacent the concave surface and is preferably contoured to conform to the concave outer surface to form an inductive source relative to the substrate. The contoured inductive coil couples energy through the pocket to create a high density uniform plasma of ionized particles proximate a substrate in the chamber.

26 Claims, 2 Drawing Sheets

SPUTTER ETCHING APPARATUS WITH PLASMA SOURCE HAVING A DIELECTRIC POCKET AND CONTOURED PLASMA SOURCE

FIELD OF THE INVENTION

This patent relates generally to sputter etching of a substrate using an ionized gas plasma, and specifically to a sputter etching apparatus with a unique plasma source configuration for producing a dense uniform plasma and a high uniform etch rate over large substrates with small device dimensions.

BACKGROUND OF THE INVENTION

In the processing of semiconductor substrates or wafers into integrated circuits, sputter etching is often used to remove a layer of material from the uppermost substrate surface. The process of sputter etching is generally known and utilizes ionized particles of a charged gas plasma to bombard the surface of a substrate and dislodge or "sputter" away substrate particles from the surface.

More specifically, the substrate to be etched is supported on an electrically charged support base or electrode within a vacuum-sealed processing chamber whereon the substrate develops an electrical charge or bias. A plasma gas is introduced into a discharge chamber opposite the surface of the biased substrate, and RF energy is generally inductively coupled to the gas such as through a coil so that an induced electric field is created inside the discharge chamber. That is, large current flow in the coil produces changing RF magnetic flux which penetrates into the discharge chamber. These changing RF magnetic fields result in changing electric fields in the discharge chamber. The energy from the induced electric field inside the chamber ionizes the gas particles. The ionized particles of the gas and free electrons collectively form what is referred to as a gas plasma or plasma cloud. The substrate is biased negatively to collect the positively charged particles from the plasma cloud. The positive ionized plasma particles are attracted to the negative substrate surface, bombarding the surface and dislodging material particles from the substrate to sputter "etch" a material layer from the substrate surface.

Conventionally, inductive energy sources utilized to create and maintain a plasma inside the chamber have been placed either inside the processing chamber and in the processing space surrounding the biased substrate, or have been placed around the outside of the chamber to surround the processing space. However, inductive energy sources positioned inside of the chamber proximate the substrate are subjected to undesired bombardment by plasma particles during the etch, and are subjected to the deposition of sputter-etched material particles thereon. Both conditions detrimentally affect the reliability of the source operation which detrimentally affects the reliability and uniformity of the plasma. Therefore, many inductive energy sources today are positioned externally around the processing chamber.

External inductive energy sources have usually included a solenoidal-shaped coil which is wound around the outside of the processing chamber to inductively couple energy to the plasma through the side chamber walls. The processing chambers and their side walls, therefore, are generally fabricated from a dielectric substance through which the inductive energy may pass, typically quartz. However, quartz processing chambers have a drawback in that particles of the substrate material, which are usually metal, do not readily adhere to quartz, and therefore, the etched material has a tendency to collect on, but eventually flake off the inside walls of the quartz chamber. Flaking detrimentally affects the plasma and contaminates the wafer. Therefore, it is an objective of the present invention to reduce flaking and substrate contamination during etching.

It is another objective of the present invention to produce a uniform, high-density plasma over a large area such that large substrate sizes might be processed. Plasma-aided manufacturing of ultra large scale integrated (ULSI) circuits requires a dense uniform plasma over large substrates having diameters of approximately 200 mm. Existing processing chambers and plasma energy sources do not adequately address such requirements and are not able to produce dense uniform plasmas over large areas.

Some sputter etching processes commonly occur at substrate voltages in the range of approximately 1,000 volts (1 kV). However, this relatively high voltage range is inappropriate for today's state-of-the-art microelectronic devices which have circuit and device features with dimensions of approximately 0.25 microns and are more susceptible to surface damage at high wafer charging voltages. As a result, lower wafer voltages, below 500 Volts, are more desirable, and preferably, voltages lower than 100 Volts are desirable, However, for an effective etch at such low voltages, a reliable, efficient and high uniform density plasma is required. Therefore, it is another objective of the present invention sputter etch substrates with small device features at low voltages without reducing the quality of the etch.

A still further objective of the present invention is to provide a sputter etch chamber and plasma source which are efficient, reliable and easy to repair and maintain. It is also an objective of the invention to produce dense uniform plasmas for a uniform etch rate at low pressures in the range of approximately 1 mTorr.

SUMMARY OF THE INVENTION

The above-discussed objectives are addressed by the sputter etch apparatus of the present invention, which utilizes an inductive plasma source with a shaped pocket and contoured coil. The inductive plasma source comprises a dielectric plate which seals the top of a processing chamber and has a centrally aligned non-conductive pocket portion or pocket with a generally concave outer surface and a generally convex inner surface which extends into the processing space inside of the processing chamber. An inductive coil is positioned outside of the chamber and is shaped within the concave outer surface of the pocket to have a generally convex shape in the direction of the processing space and the substrate. The pocket and the contoured coil extend partially inside of the chamber and are effective to produce a dense uniform plasma in the processing space. The coil construction design also effects the plasma uniformity. For example, a spiral coil, zig-zag coil or single-turn coil might be utilized to form the convex shape. Also coils having thin or flat wires with cross-sections that are not circular may be utilized.

The inductive coil is coupled to an RF power supply operating preferably at approximately 450 KHz, and is contoured or shaped within the pocket of the dielectric plate such that it extends partially into the processing space to present a generally convex-shaped coil opposite a biased substrate. Preferably, the coil is contoured to closely follow the contour of the outer concave surface of the pocket but may be contoured to configure generally to the shape of the pocket. The substrate is biased by a substrate support which is connected to an RF power supply operating preferably at approximately 13.56 MHz. The pocket and the contoured inductive coil are operable to produce a dense uniform plasma over a wide area, thus yielding a uniform etch across wafers which are eight inches (200 mm) or greater in diameter. A dense uniform plasma is produced at low pressures around 1 mTorr, and the invention is effective to produce reliable, efficient etches at low substrate bias voltage levels of approximately 50 Volts.

In one preferred embodiment of the invention, RF tuners are utilized with the substrate RF power supply and the coil RF power supply in order to minimize reflected power from the inductive coil and the substrate support to achieve high electrical efficiency. An electrostatic shield, preferably made of a thin metal mesh, is positioned in the pocket between the pocket and the inductive coil and is generally contoured with the pocket in order to reduce the capacitive energy coupling of the coil to the plasma and to thereby raise the efficiency of the inductive energy coupling.

To selectively vary the uniformity and density of the plasma, the dimensions of the pocket and specifically the shape and degree of curvature of the convex inner surface are varied along with the corresponding configuration of the contoured inductive coil within the pocket. In accordance with the principles of the present invention, the pocket shape and coil configuration may be tailored to a specific processing chamber or substrate element in order to produce a dense uniform plasma proximate the substrate. It has been experimentally determined that increasing the depth of the pocket into the processing space and the degree of curvature of the convex inner surface and increasing the corresponding depth of the contoured coil tends to improve the uniformity of the plasma within the processing space.

The dielectric plate, pocket and the inductive coil are positioned at the top of the metal processing chamber and are generally centrally disposed with respect to the chamber to extend into the chamber and thereby inductively couple energy to the plasma. Since the inductive coil is not wound around the chamber to surround the processing space, the body of the chamber may be made of metal or some other conductive material and is preferably stainless steel. The sputter etched material adheres more readily to metal than to quartz, thus reducing flaking and contamination of the substrate. Alternatively, shields might be positioned within the processing space to surround the wafer and receive the sputter etched material without concern that the shield material, such as metal, would short circuit the inductive coupling between the coil and the plasma. The metal chamber walls may be periodically cleaned of the deposition material, while the metal shields might be removed and replaced with clean shields for further etching.

In an alternative embodiment of the invention, a magnetic ring surrounds the metallic chamber and the wafer and wafer support. The magnetic ring has alternating north/south magnetic regions around its circumference and induces a magnetic field around the chamber to confine the plasma and increase the plasma density proximate the substrate. The magnetic ring also increases the uniformity of the plasma by preventing plasma diffusion and leakage into the chamber walls.

The present invention operates to provide dense uniform plasmas at low voltage and low pressure, and is particularly suitable for etching semi-conductor devices with 0.25 micron dimensions without damage to the devices. Furthermore, the sputter etching apparatus of the present invention utilizes a design which is easy to service and maintain. The plasma produced by the plasma source is stable and repeatable and produces a highly uniform etch rate across large substrates. These and other features are more readily apparent from the brief description of the drawings and the detailed description of the invention set forth hereinbelow.

BRIEF DESCRIPTION OF THE DRAWING

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

Figure 1:
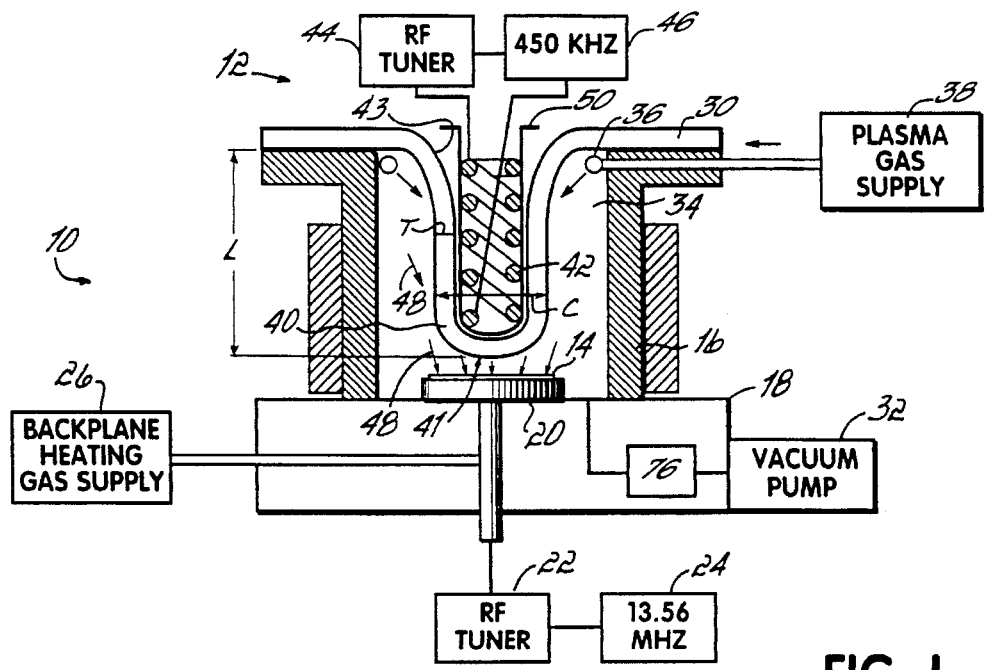
FIG. 1 is a schematic view, in partial cross-section, of the sputter etching apparatus of the present invention showing the inductive plasma source.

Referring to FIG. 1, a sputter etching apparatus 10 of the present invention is illustrated utilizing a the unique inductive plasma source 12 of the invention for sputter etching a substrate wafer 14. The sputter etching apparatus 10 comprises a stainless steel processing chamber 16 which includes a base 18 and a substrate support or platen 20 to hold substrate 14 inside of the chamber 16 while it is being sputter etched.

The substrate support 20 is coupled to an RF power supply, including an RF tuner 22, and preferably, a 13.56 MHz source 24. The source may operate in a range of approximately 1 MHz to 15 MHz for sufficient biasing of the substrate. Source 24 biases substrate 14 to produce sputter etching as described further hereinbelow. Substrate support 20 is also coupled to a backplane heating gas supply 26 for providing backplane gas to heat or cool substrate 14. Substrate support 20 preferably includes channels formed therein (not shown) for distributing the heating gas uniformly over the backside of the substrate 14.

Processing chamber 16 is closed and sealed at the top end by a dielectric plate or window 30 which couples to the stainless steel chamber 16 for a vacuum-tight seal. A vacuum pump 32 is coupled to the processing chamber 16 through base 18 to vacuum the internal processing space 34, which is created adjacent substrate 14 by processing chamber 16 and dielectric plate 30. A gas dispersing ring 36 is positioned around the top of processing chamber 16 adjacent dielectric plate 30 and is coupled to a plasma gas supply 38. The gas dispersing ring 36 disperses the plasma gas uniformly around the processing space 34, and specifically around substrate 14.

In accordance with the principles of the present invention, the dielectric plate 30 includes a generally non-conductive pocket portion or pocket 40, which is centrally disposed in the plate 30 and extends downwardly from the top of chamber 16. Pocket 40 has a generally convex inner surface 41 which projects into processing space 34 toward substrate 14. Preferably, the entire dielectric plate 30 is non-conductive, but it is particularly critical that pocket 40 be non-conductive despite the construction of the remaining portions of the plate 30. The non-conductive pocket 40 extends from dielectric plate 30 into processing space 34 toward the substrate support 20 and substrate 14. To provide energy to ignite and sustain a plasma within the processing space 34, an inductive coil 42 is positioned outside the chamber 16 within the non-conductive pocket 40 of dielectric plate 30. As illustrated in FIG. 1, inductive coil 42 is preferably wound around inside pocket 40 and is contoured to follow the generally outer concave surface 43 of pocket 40.

Pocket 40 preferably has a generally circular transverse cross section and the coil 42 follows concave surface 43 around pocket 40 for creating a uniform plasma around the substrate. As the coil 42 follows the outer concave surface 43 of pocket 40, it forms a contoured coil which is generally convex-shaped in the direction of substrate 14 which extends into the processing space generally coaxially with pocket 40 as shown in FIG. 1. In one embodiment of the invention, the pocket has a wall thickness T of approximately 19 mm, a circumference C of approximately 102 mm and a length L of approximately 150 mm.

The inductive coil 42 is coupled to an RF power supply, including an RF tuner 44, and preferably, a 450 KHz source 46. A tuner having an operating range from 400 KHz to 15 MHz should be generally useful with the present invention to create a plasma. The RF current from source 46 which flows through inductive coil 42 induces a time varying RF electric field inside of the processing space 34. Because pocket 40 is non-conductive, the inductive electric field from contoured coil 42 is coupled through pocket 40 and then to plasma gas from supply 38, which is dispersed around pocket 40 and coil 42 by ring 36. The inductive electric field produced within the processing space 34 ionizes the gas and creates a discharge of ionized gas particles or plasma (not shown) within the processing space 34 and proximate substrate 14. Substrate 14 which is biased by RF source 24 attracts the ionized gas particles from the plasma, and the particles, designated by arrows and reference numeral 48, bombard the upper surface 15 of the substrate 14 to thereby sputter etch substrate material away from the surface 15.

It has been experimentally determined that the shapes of pocket 40 and contoured inductive coil 42 create a uniform sputtering plasma having a high density of ionized gas particles 48 proximate the upper surface 15 of substrate 14. Substrate surface 15 is bombarded and the present invention produces a high uniform sputter etching rate across surface 15. It has also been found that the non-conductive pocket 40 and the contoured coil 42, which is wound around the outer concave surface 43 of pocket 40, provide a high density uniform plasma over a large substrate surface. Therefore, the present invention is particularly suitable for sputter etching circular substrates having a diameter greater than or equal to eight inches, such as 300 mm substrates. Furthermore, it has been experimentally determined that the plasma produced by the pocket and contoured coil is stable and is repeatable for more consistent sputter etching.

The construction design of the coil also would affect the plasma uniformity. For example, the coil 42 might be a spiral coil as illustrated in the Figures or a zig-zag coil, or may even be a single-turn coil. The wire used to form the coil 42 also would affect the plasma. A wire having a circular cross-section is shown in the Figures. However, a thin or flat wire might also be utilized in accordance with the principles of the present invention.

Sputter etching apparatus 10 is electrically efficient and utilizes RF tuners 22, 44 to reduce the reflected RF power from the substrate support 20 and inductive coil 42, respectively. In a preferred embodiment of the invention, a Faraday electrostatic shield 50 is utilized around the coil 42 adjacent the outer concave surface 43 of the dielectric plate pocket 40 and between the coil 42 and pocket 40. The electrostatic shield, which is preferably a thin mesh, reduces the capacitive coupling of the inductive coil 42 to the plasma, and thus raises the efficiency of the coupling of inductive energy to the plasma.

The uniform distribution of the plasma gas by ring 36 and the dense uniform plasma of the present invention produce high uniform etch rates across large substrates. Furthermore, the dense uniform plasma produced by pocket 40 and contoured coil 42 yields good etch results even at low vacuum pressures in the range of 1 mTorr. Still further, sputter etching apparatus 10 may be operated at very low wafer biasing voltages in the range of approximately 50 volts, thus reducing sputter damage to the wafer. The present invention is particularly suitable for substrates with very fine devices and integrated circuit features having dimensions of approximately 0.25 microns.

With pocket 40 and the contoured coil 42 of the present invention, inductive energy is coupled to the plasma through the top of chamber 16 and through dielectric plate 30. Therefore, processing chamber 16 may be made of stainless steel, instead of a dielectric material, such as quartz, because inductive energy does not have to be coupled through the side walls of the processing chamber 16. The sputter etched material originating from substrate 14 adheres more readily to stainless steel than to a dielectric material such as quartz. As a result, the inner wall 17 of the processing chamber 16 more readily holds the sputter etched material to prevent flaking of the material into the processing chamber 34, thus reducing contamination of the sputter etched wafer. The wall 17 may then be cleaned when necessary to remove the etched material. Alternatively, a metal shield, such as shield 52, may be utilized between the inner wall 17 and substrate 14 to catch sputter etched material. The shield may be metal, such as stainless steel, or may be made of a dielectric material. Upon reaching the end of its useful life, the shield 52 may simply be removed and cleaned or discarded. The shield should not interfere with the coupling of energy to the plasma, because energy is coupled through the top of the chamber.

The inductive contoured coil 42 is protected from the etch environment by pocket 40, and thus, is not exposed to the sputter etching process. This increases the useful life and reliability of the coil 42 and yields a more reliable sputter etching process.

Figure 2:
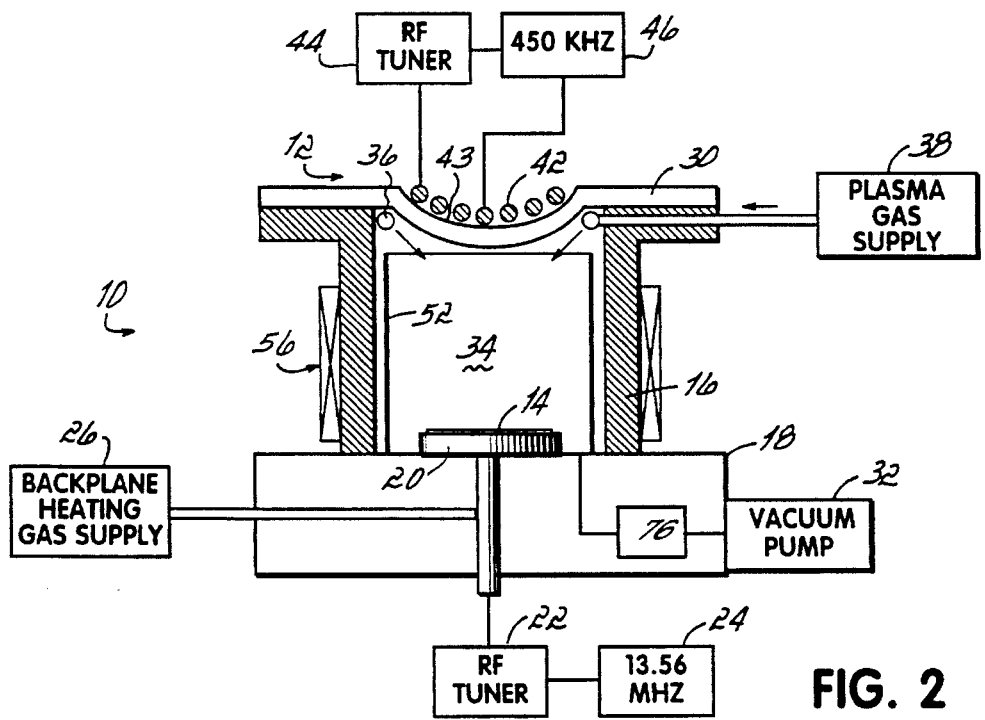
FIG. 2 is a schematic view, in partial cross-section, of an alternative embodiment of the inductive plasma source of the present invention shown with a plasma-confining magnetic ring.
Figure 2A:
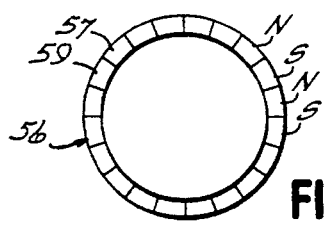
FIG. 2A is a schematic top view of the magnetic ring of FIG. 2.

To further increase the uniformity and density of the sputtering plasma, a magnetic ring 56 may be utilized around the processing chamber 16 as illustrated in FIG. 2. A magnetic ring 56, which preferably utilizes vertically aligned elongated regions 57, 59 of alternating polarity around the circumference of the ring as illustrated in FIG. 2A, creates a magnetic field within the processing space 34 adjacent the inner wall 17 of chamber 16. The magnet 56 and magnetic field created thereby have been found to prevent plasma leakage by preventing diffusion of ionized plasma particles into wall 17 of chamber 16, thus yielding a more uniform plasma. Furthermore, the magnetic field created by ring 56 has been found to confine the plasma around support 20 and substrate 14, and thus increases the density of the sputter etching plasma.

Figure 2B:
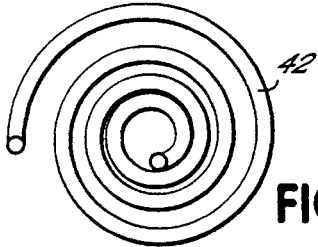
FIG. 2B shows a top view of the shape of the coil utilized in FIG. 2.

The shape of the non-conductive pocket 40 and the shape of the contoured coil 42 may be varied to improve plasma characteristics within the processing space 34. By varying the depth of pocket 40 and the degree of curvature of the inner surface 41, and by varying the resulting shape of the contoured coil 42, the plasma uniformity and density are affected. It has been found experimentally that the greater the pocket depth and the convexity of the inner surface 41 and the greater the depth of coil 42, the better the uniformity of the resultant plasma. However, as will be appreciated by a person skilled in the art, the shape and dimensions of pocket 40 and coil 42 may be tailored according to the processing chamber 16, the internal configurations within the processing space 34, as well as the size and location of substrate 14. FIG. 1 shows an extreme case in which pocket 40 is generally cylindrical and the coil 42 is contoured and dimensioned to extend almost the entire length of the processing chamber 16 to terminate very close to substrate support 20 and substrate 14. FIG. 2 shows a more shallow pocket 40 and relaxed curvature or convexity of the inner surface 41 and coil 42. As illustrated in FIGS. 1 and 2, the resulting shape of the con-toured coil 42 is dependent upon the depth and shape of pocket 40 and the shape of the generally concave outer surface 43. The shape of the coil 42 may range anywhere from solenoidal, as illustrated in FIG. 1, to a flatter convex-shaped coil as illustrated in FIG. 2. As will be appreciated, very shallow pockets utilize an inductive coil, which is almost flat or "pancake" in shape. FIG. 2B shows a top view of the shape of the coil utilized in FIG. 2.

To explain the operation of the plasma source 12 of the invention, an explanation of the plasma ignition scheme and etching is helpful. FIG. 3A is a schematic diagram of the gas flow components for delivering plasma gas to the processing chamber 16 and backside heating gas to the substrate support 20. The gas flow components are synchronized to produce a gas pressure burst for easy ignition of the plasma and to subsequently create a sufficient gas flow to sustain the ignited plasma.

Figure 3B:
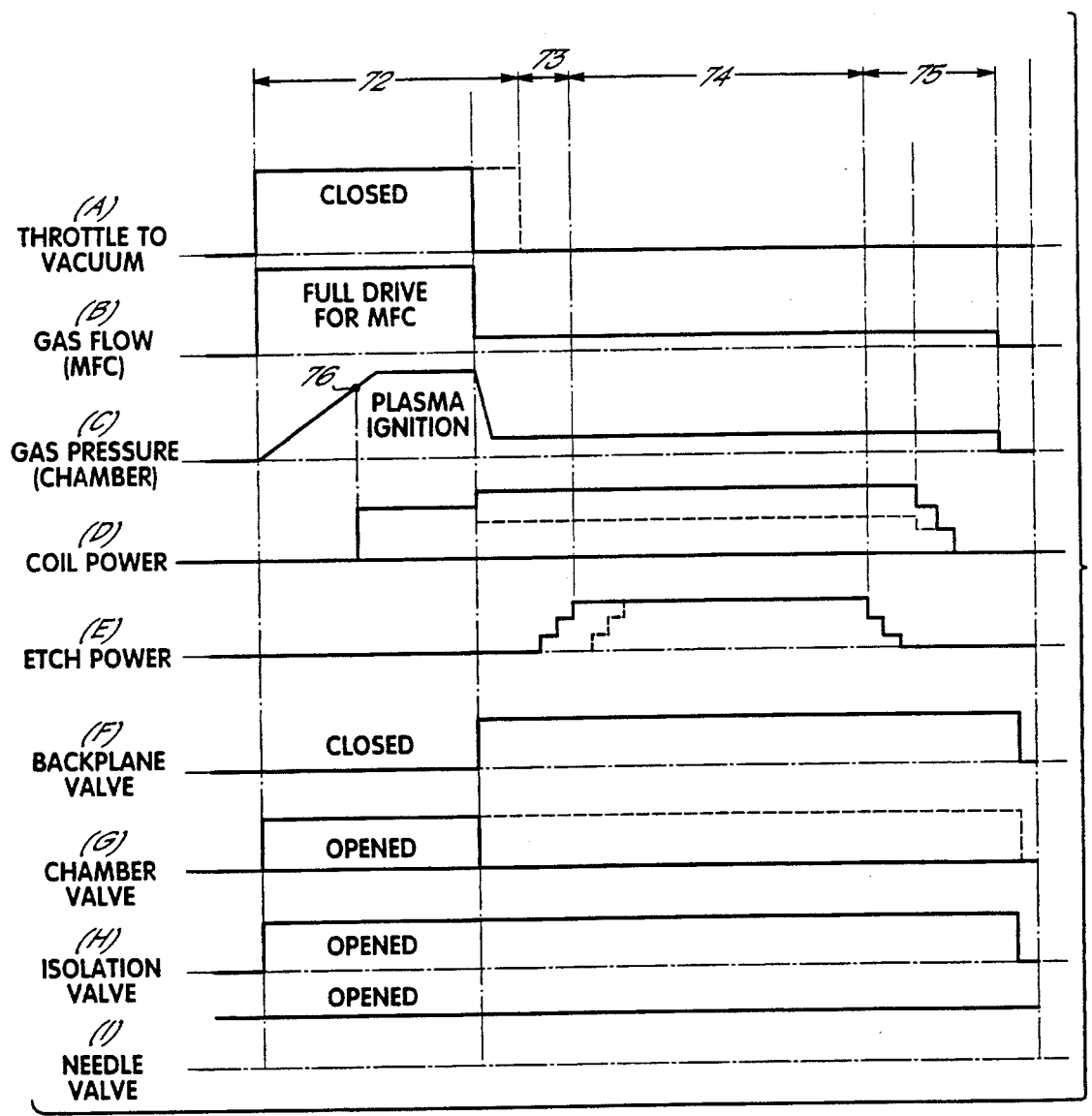
FIG. 3B is a timing chart illustrating operation of the RF power supplies and gas supply components for pressure burst ignition of a plasma in operation of the present invention.
Figure 3A:
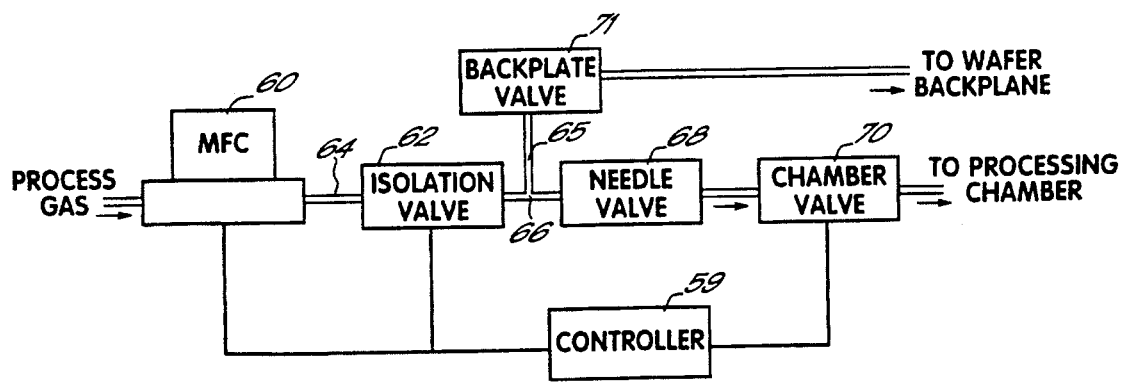
FIG. 3A is a schematic diagram of the gas flow components for delivering sputtering gas and backside heating gas to the sputter etching apparatus of FIGS. 1 and 2.

FIG. 3B is a timing chart illustrating the operating sequence and synchronization of the various gas supply components illustrated in FIG. 3A to produce pressure burst ignition and a subsequent plasma. The gas flow system includes a mass flow controller 60 (MFC) for controlling the gas flow rate from the gas supplies, such as plasma gas supply 38 or backplane heating gas supply 26. Preferably, the gas used for both purposes is Argon, and a single gas source may be coupled to mass flow controller 60. An isolation valve 62 is coupled at the output of the mass flow controller and may be incorporated with the structure of the mass flow controller 60. After the isolation valve 62, the gas supply line 64 is split between the backplane branch 65 and a processing chamber branch 66. A needle valve 68 provides course adjustment of the gas pressure in the processing chamber 16. The chamber valve 70, in line with needle valve 68, provides a more precise pressure control of the plasma gas pressure within the processing chamber 16. A backplane valve 71 controls the flow of gas to substrate support 20 for backplane heating of substrate 14 during sputter etching. All of the gas flow components of FIG. 3A and RF sources 24 and 46 are preferably coupled to a controller 59 for timed operation, except for needle valve 68 which is manually opened and closed.

Referring to FIG. 3B, the full process interval for sputter etching a substrate may be divided into a pressure burst interval denoted by reference numeral 72, a substrate power interval denoted by reference numeral 73, a soft etch process interval denoted by reference numeral 74, and a power down interval denoted by reference numeral 75. As illustrated in line A of FIG. 3B, a throttle 76, which is coupled to vacuum pump 32 (see FIGS. 1 and 2) is kept closed, and the mass flow controller 60 is opened for full gas flow at approximately 288 sccm, as illustrated in line B. As illustrated in line C, the gas pressure in processing chamber 16 begins to steadily rise due to the high flow of gas and the absence of vacuum pumping. During the pressure build-up within chamber 16, the isolation valve 62, needle valve 68, and the chamber valve 70 are all open, as illustrated in lines I, H, and G of FIG. 3B in order to allow gas flow into the processing chamber 16. During the initial pressure build-up within pressure burst interval 72, no backplane gas is delivered to substrate support 20, and therefore, valve 71 is closed (line F). Furthermore, the RF power to the inductive coil 42 is off (line D) as is the RF etch power to substrate 14 (line E). Referring again to line C, when the processing chamber pressure rises to a set point, e.g. 30 mTorr, designated by reference numeral 76, controller 59 turns on the RF source 46 to provide power to inductor coil 42 (line D). An 800 watt power setting for RF source 46 has proven sufficient to ignite a plasma in the apparatus 10 of the invention. Upon the ignition of a plasma, which is indicated at the end of pressure burst interval 72, the throttle 76 to the vacuum pump 32 is opened, and the gas flow rate of the MFC 60 is reduced (line B), thus, causing a drop in the processing chamber pressure (line C). The gas flow through the MFC 60 is maintained at a level to sustain the ignited plasma. The power to coil 42 (line D) is adjusted from the 800 watt ignition level between upper and lower levels as shown to produce a suitable plasma. Within the power-up interval 73, controller 59 turns on source 24 for etching substrate 14. As illustrated in line E, the RF source 24 has an associated delay time to build up to the desired output level, which may be around 50 volts. At the time of plasma ignition, the backplane valve 71 is opened to provide backside heating gas to substrate support 20 to heat substrate 14 (line F). The processing chamber valve 70 is alternately opened and closed during the sputter etching process to maintain a desired gas flow within the processing chamber. The plasma is sustained and the substrate 14 is biased during the soft etch process interval 74. Upon reaching a predetermined etch time, the power to the substrate (line E) is shut off during the power down interval 75. The etch power to the substrate is shut off before the coil power (line D) in order to determine the exact duration of the etch and to prevent damage to the substrate which may occur if the substrate remains biased when the plasma power is turned off. As illustrated in lines D and E of FIG. 3B, both the RF coil source and the RF substrate source have predetermined delays at their outputs when switched off. At the end of the power-down interval 75, the mass flow controller is closed (line B), the chamber valve is closed (line G), and the isolation valve is closed (line H), thereby reducing the gas pressure (line C) in the processing chamber 16.

As illustrated in line A, the opening of the vacuum throttle 76 may be delayed if the gas flow and pressure within chamber 16 is not sufficient to ignite a plasma. The delay is illustrated by a dashed line in line A. Accordingly, the etch power to substrate 14 would also be delayed as illustrated by the dashed line in line E of FIG. 3B.

The processing apparatus of the present invention provides a dense uniform plasma to etch substrate 14. The apparatus is suitable for substrates utilizing small circuit devices and features, and has a design which provides ease of service and maintenance. The invention is capable of providing sufficiently uniform and dense plasmas across large substrates at lower pressures and low substrate biasing voltages.

In addition to the operation of pocket 40 and contoured coil 42, the shape of the pocket and its depth of extension into the processing space 34 may physically affect the plasma to yield a more uniform etch. For example, a deep pocket 40 as is illustrated in FIG. 1 may physically displace the plasma from above the center of substrate 14 to reduce the etch rate at the center of the substrate which is often higher than the etch rate at the substrate periphery. Therefore, the physical displacement may yield a more uniform etch. Further detailed discussion of such a plasma displacing plug is provided in Hieronymi et al., U.S. Pat. No. 5,391,231, issued Feb. 21, 1995, and is incorporated herein in its entirety.

The pockets 40 illustrated in the Figures are all generally hollow and hold the contoured coil 42. Alternatively, the pocket 40 may be filled with a dielectric material or other suitable material (not shown) which will surround the contoured coil 42 in pocket 40 and thereby embed the coil therein.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A processing apparatus for sputter etching the surface of a substrate with an ionized plasma, the apparatus comprising:

a processing chamber defining a processing space and including a substrate support therein for supporting and electrically biasing a substrate in said processing space;

a gas inlet for introducing sputtering gas into said processing space proximate the substrate support; and a plasma source coupled to an end of the processing chamber to seal the chamber and create a plasma within the chamber, the plasma source comprising:

a dielectric plate having a non-conductive pocket portion with a convexly-curved inner surface and a concavely-curved outer surface, the pocket portion physically extending into said processing space in the chamber toward said substrate support and terminating proximate the substrate support so that the concavely-curved outer surface curves outwardly in the direction of said substrate support;

an inductive coil positioned outside of the chamber and inside the pocket portion of said dielectric plate, the inductive coil being contoured inside of said pocket portion along the convexly-curved inner surface to have a generally concave shape in the direction of the substrate support which coincides with the concavely-curved outer pocket surface of the pocket, the concavely shaped coil operable to efficiently inductively couple energy through the pocket portion to said sputtering gas for generating and sustaining a plasma of ionized gas particles;

the concavely shaped coil and coinciding concavely-curved outer pocket surface creating a high density uniform plasma of ionized particles proximate a surface of a biased substrate to bombard the surface thereof and produce a high sputter etching rate uniformly across the substrate surface.

2. The processing apparatus of claim 1 wherein the concavely shaped inductive coil is formed of wire.

3. The processing apparatus of claim 1 wherein the electrical energy source includes an RF energy source.

4. The processing apparatus of claim 3 wherein the RF energy source operates at a frequency approximately in the range of 450 KHz to 15 MHz, 5. The processing apparatus of claim 3 wherein said electrical energy source includes an RF tuner coupled to the RF energy to reduce energy reflections back to the RF energy source when energy is coupled to the plasma.

6. The processing apparatus of claim 1 further comprising an RF energy source coupled to the substrate support to bias a substrate on the support with RF energy.

7. The processing apparatus of claim 6 wherein the RF energy source operates at a frequency approximately in the range of 1 MHz to 15 MHz.

8. The processing apparatus of claim 1 wherein the plasma source further comprises a metal electrostatic shield positioned in the pocket portion for surrounding at least a portion of the coil, the electrostatic shield operable to absorb capacitive energy between the coil and the plasma to effectively reduce the capacitive coupling of energy from the coil to the plasma.

9. The processing apparatus of claim 8 wherein the shield is formed of a metal mesh.

10. The processing apparatus of claim 1 wherein the gas inlet is located proximate the top of the chamber adjacent said pocket portion and is angled to direct sputtering gas downwardly into the processing space proximate the substrate support.

11. The processing apparatus of claim 1 further comprising a gas ring above the substrate support and surrounding the pocket portion for directing gas into the processing space from around the pocket portion to produce a uniform plasma.

12. The processing apparatus of claim 1 further comprising a shield positioned around the inside of the chamber for capturing the sputter etched material and preventing the material from contaminating the substrate surface.

13. The processing apparatus of claim 12 wherein the shield is metal.

14. The processing apparatus of claim 1 further comprising a magnetic ring surrounding the chamber for inducing a magnetic field in the processing space proximate the substrate support to magnetically confine the sputtering plasma and increase the uniformity and density of the plasma to increase the sputter etch rate at the substrate surface.

15. A plasma source for creating a plasma inside of a processing chamber to sputter etch a biased substrate inside the chamber, the plasma source comprising:

a dielectric plate coupled to an end of the chamber, the dielectric plate including a non-conductive pocket portion with a convexly-curved inner surface and a concavely-curved outer surface, the pocket portion physically extending into said processing chamber toward a biased substrate in the chamber and terminating proximate the substrate so that the concavely-curved outer surface curves outwardly in the direction of the substrate;

an inductive coil positioned outside the chamber and inside the pocket portion of said dielectric plate, the inductive coil being contoured inside of said pocket portion along the convexly-curved inner surface to have a generally concave shape in the direction of the substrate which coincides with the concavely-curved outer surface of the pocket, the concavely shaped coil operable to efficiently inductively couple energy to sputtering gas inside the chamber for generating and sustaining a plasma of ionized gas particles;

the concavely shaped coil and coinciding concavely-curved outer pocket surface creating a high density uniform plasma of ionized particles proximate a surface of a biased substrate to bombard the surface thereof and produce a high sputter etching rate uniformly across the substrate surface.

16. The plasma source of claim 15 wherein concavely shaped inductive coil is formed of wire.

17. The plasma source of claim 15 further comprising a metal electrostatic shield positioned in the pocket portion for surrounding at least a portion of the inductive coil, the electrostatic shield operable to absorb capacitive energy between the coil and the plasma to effectively reduce the capacitive coupling of energy from the coil to the plasma.

18. The plasma source of claim 17 wherein the shield is formed of metal mesh.

19. The plasma source of claim 15 further comprising a gas ring surrounding the pocket portion to direct gas into the processing chamber from around the pocket portion to produce a uniform plasma.

20. The plasma source of claim 15 further comprising a magnetic ring surrounding the chamber for inducing a magnetic field proximate a substrate to magnetically confine the sputtering plasma and increase the uniformity and density of the plasma to increase the sputter etch rate at the substrate surface.

21. A method of sputter etching the surface of a substrate with an ionized plasma, the method comprising:

electrically biasing a substrate inside of a processing chamber;

introducing sputtering gas into said processing chamber proximate the substrate;

coupling, to an end of the processing chamber, a dielectric plate having a non-conductive pocket portion with a convexly-curved inner surface and a concavely-curved outer surface, the pocket portion physically extending into said processing chamber proximate said substrate;

positioning the substrate in the chamber such that the pocket portion terminates proximate the substrate and the concavely-curved outer surface curves outwardly in the direction of said substrate;

positioning an inductive coil inside the pocket portion of said dielectric plate and inductively coupling energy to said sputtering gas through the pocket portion to generate and sustain a plasma of ionized gas particles;

contouring the inductive coil inside of the pocket portion along the convexly-curved inner surface and forming a coil with a generally concave shade curving outwardly in the direction of the substrate to coincide with the concavely-curved outer surface for creating a high density uniform plasma of ionized particles proximate a surface of the biased substrate to bombard the surface thereof and produce a high sputter etching rate uniformly across the substrate surface.

22. The method of claim 21 wherein the electrical energy source includes an RF energy source.

23. The processing apparatus of claim 21 further comprising placing a metal electrostatic shield in the pocket portion to surround a portion of the coil, the electrostatic shield operable to absorb capacitive energy between the coil and the plasma to effectively reduce the capacitive coupling of energy from the coil to the plasma.

24. The method of claim 21 further comprising introducing sputtering gas into the processing chamber from a gas ring above the substrate and surrounding the pocket portion to produce a uniform plasma.

25. The method of claim 21 further comprising placing a metal shield around the inside of the chamber and capturing the sputter etched material with the shield to prevent the material from contaminating the substrate surface.

26. The method of claim 21 further comprising surrounding the outside of the chamber with a magnetic ring and inducing a magnetic field in the processing space proximate the substrate support to magnetically confine the sputtering plasma and increase the uniformity and density of the plasma to increase the sputter etch rate at the substrate surface.

* * * * *

UNITED STATES PATENT AND TRADEMARK OFFICE
CERTIFICATE OF CORRECTION

PATENT NO. : 5,556,521
DATED : September 17, 1996
INVENTOR(S) : Ebrahim Ghanbari It is certified that error appears in the above-indentified patent and that said Letters Patent is hereby corrected as shown below:

In Column 12, line 15 it reads "shade", and it should read --shape--.

Signed and Sealed this

Thirtieth Day of September, 1997

Attest:

BRUCE LEHMAN

Attesting Officer

Commissioner of Patents and Trademarks